United States Patent
Schaefer

(10) Patent No.: US 12,354,691 B2
(45) Date of Patent: Jul. 8, 2025

(54) INDICATING VALID MEMORY ACCESS OPERATIONS

(71) Applicant: Micron Technology, Inc., Boise, ID (US)

(72) Inventor: Scott E. Schaefer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 364 days.

(21) Appl. No.: 17/883,237

(22) Filed: Aug. 8, 2022

(65) Prior Publication Data

US 2023/0063494 A1     Mar. 2, 2023

Related U.S. Application Data

(60) Provisional application No. 63/236,959, filed on Aug. 25, 2021.

(51) Int. Cl.
| | | |
|---|---|---|
| *G11C 29/50* | (2006.01) | |
| *G11C 29/20* | (2006.01) | |
| *G11C 29/52* | (2006.01) | |

(52) U.S. Cl.
CPC ........ *G11C 29/50004* (2013.01); *G11C 29/20* (2013.01); *G11C 29/52* (2013.01); *G11C 2029/5004* (2013.01)

(58) Field of Classification Search
CPC ... G11C 29/20; G11C 29/50004; G11C 29/52; G11C 2029/5004
USPC .................................................. 714/706, 721
See application file for complete search history.

(56) References Cited

U.S. PATENT DOCUMENTS

| | | | | |
|---|---|---|---|---|
| 10,719,248 | B2* | 7/2020 | Hasbun | G11C 13/0033 |
| 11,055,000 | B2* | 7/2021 | Hasbun | G11C 13/0035 |
| 11,829,612 | B2* | 11/2023 | Boehm | G06F 3/0688 |
| 2019/0018612 | A1* | 1/2019 | Park | G11C 29/52 |
| 2019/0324672 | A1* | 10/2019 | Hasbun | G06F 13/4282 |
| 2019/0347035 | A1* | 11/2019 | Hasbun | G06F 3/0659 |
| 2020/0053517 | A1* | 2/2020 | Nichols | H04W 12/125 |
| 2020/0089567 | A1* | 3/2020 | Takeda | G06F 11/1048 |
| 2020/0319809 | A1* | 10/2020 | Hasbun | G06F 3/0653 |
| 2021/0263661 | A1* | 8/2021 | Hasbun | G06F 3/0653 |
| 2022/0057945 | A1* | 2/2022 | Boehm | G06F 3/0688 |

(Continued)

OTHER PUBLICATIONS

Wang et al., Robust Statistics Counter Arrays with Interleaved Memories, Sep. 2013, IEEE, vol. 24, No. 9, pp. 1894-1907. (Year: 2013).*

*Primary Examiner* — John J Tabone, Jr.
(74) *Attorney, Agent, or Firm* — Holland & Hart LLP

(57) ABSTRACT

Methods, systems, and devices for memory operations are described. A command may be received by a memory device and from a device. Both the device and the memory device may maintain counters of valid operations. A request for a value associated with a counter at the memory device may be received from the device. Based on receiving the request, a value of the counter may be transmitted to the device. The values of the counters may be compared to determine whether invalid data has been obtained by the device. Also, a pin associated with communicating error correction information may be coupled with a voltage source based on receiving a signal. The pin may remain coupled with the voltage source until a command is processed or an end of the signal. Whether the pin is coupled with the voltage source may indicate a validity of associated data.

21 Claims, 9 Drawing Sheets

(56) References Cited

U.S. PATENT DOCUMENTS

2022/0155991 A1*  5/2022  Neudorf ................ G06F 3/0673
2023/0063494 A1*  3/2023  Schaefer .......... G11C 29/50004

* cited by examiner

INDICATING VALID MEMORY ACCESS OPERATIONS

CROSS REFERENCE

The present application for patent claims the benefit of U.S. Patent Application No. 63/236,959 by Schaefer, entitled "INDICATING VALID MEMORY ACCESS OPERATIONS," filed Aug. 25, 2021, which is assigned to the assignee hereof, and which is expressly incorporated by reference in its entirety herein.

FIELD OF TECHNOLOGY

The following relates generally to one or more systems for memory and more specifically to indicating valid memory access operations.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
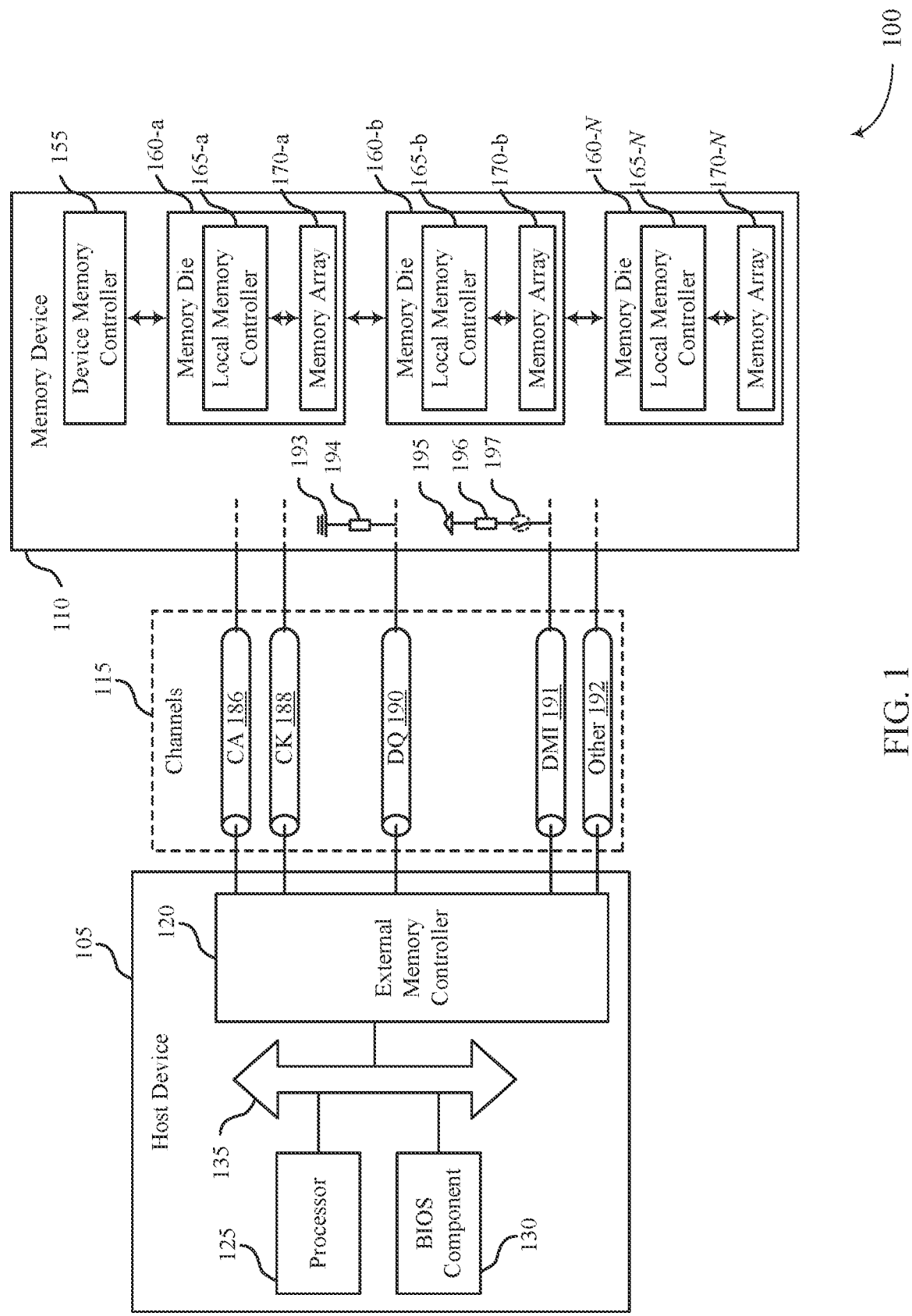
FIG. 1 illustrates an example of a system that supports indicating valid memory access operations in accordance with examples as disclosed herein.

A memory device may store data for a host device, which may access the stored data at a later time. In some examples, a failure may occur when data is communicated between the host device and the memory device. In some examples, a failure may occur when a host device treats invalid data received from (or determined as being received from) a memory device as valid data. An acceptable failure rate associated with storing and accessing the data stored at a memory device may be based on the consequences of a failure—for example, an acceptable failure rate of a system used in autonomous vehicles may be stricter than for other applications, such as desktop computing.

For safety applications, enhanced techniques may be used to decrease a failure rate associated with a memory device. Error management signaling may be communicated between a memory device and host device to reduce a quantity of failures. The error management signaling may include a valid operation signal (e.g., a valid read operation flag (VROF) signal), a syndrome check signal, a master error log signal, a link error correction code (ECC) signal, or any combination thereof. In some examples, a subset of available protocols for communicating data between a host device and memory device may support the communication of one or more of the supplemental error management signals.

A host device may use a protocol that does not support communicating one or more of the valid operation signal, the syndrome check signal, or the master error status signal—though, in some examples, the memory device may still generate the underlying data for the signals. Thus, a host device may be unable to exchange supplemental error management signaling with a memory device. For example, the host device may be unable to receive a valid operation signal, and thus, may be unable to determine whether a valid operation is being performed in a duration during which the operation is expected. Accordingly, communication errors between the memory device and host device may increase—e.g., if the host device uses invalid data obtained during a duration during which the operation was expected to be performed but was not. Thus, a failure rate associated with the memory device may also increase, and, in some cases, may exceed a threshold.

To support alternative measures for communicating of supplemental error management information between a memory device and a host device, enhanced signaling techniques for the supplemental management information may be used. In some examples, transmission-side counters and reception-side counters that keep track of valid operations may be used to indicate valid operations (e.g., valid read operations). A memory device may update a counter at the memory device each time a valid command (e.g., read command) is received or performed at the memory device. Receiving a valid command may include successfully decoding a signal received at the memory device in a command/address channel. In some examples, a value of the counter may be stored in a register at the memory device, and the memory device may write an updated value to the register each time a valid command is received or performed. Also, the host device may update a counter at the host device each time a command is transmitted to the memory device. In some examples, the host device may request to read the register that stores the counter of the memory device. The host device may compare the received value of the counter at the memory device with a value of the counter at the host device. If the values of the counters match, the host device may determine that the data read from the memory device was valid for a duration spanning an initialization and reading of the counters. If the values of the counters differ, the host device may determine that at least a portion of the data read from the memory device was invalid.

By maintaining a record of commands sent at a transmitting device and commands received at or performed by a receiving device, the device may be able to determine whether each command of a set of commands (e.g., each command sent during a specific duration) have been executed by the receiving device. That is, an indication of whether a valid operation was executed for each command in the set of commands may be determined, and, in some examples, the conclusion that an invalid operation was incorrectly deemed valid by the transmitting device may be determined—e.g., if the records at the host device and memory device are mismatched.

In some examples, a valid operation signal may be encoded into a link error management signal to indicate valid operations in real time. For example, a memory device may couple an error management channel with a voltage source (e.g., a high supply voltage source) based on receiving a signal from a host device that provides a clock for reading or writing to the memory device (which may be referred to as a write clock (WCK) signal). The memory device may maintain the coupling between the error management channel and the voltage source until a command (e.g., a read command or a write command) is processed at the memory device or the write clock signal ends. If a memory device fails to receive a command transmitted from a host device, the error management channel may remain coupled with the voltage source throughout a duration for performing the operation associated with the command. Particularly, the error management channel may remain coupled with the voltage source during a duration of the operation for transmitting link error management information. In such cases, the host device may determine the link error management signal represents all logic 1's and determine that the operation is invalid, that the data associated with the operation is invalid, or both. Also, the memory device may isolate the error management channel from the voltage source after the WCK signal ends.

If a memory device successfully receives a command transmitted from the host device, the error management channel may be isolated from the voltage source throughout a duration for performing the operation associated with the command. In such cases, the error management channel may be driven based on error management information determined for the data. The host device may also determine the operation is valid and that the link error management signal includes error management information for a corresponding set of data.

By coupling an error management channel with a voltage source after receiving a WCK signal, whether a valid operation is being performed for a transmitted command may be indicated in real-time. Also, by opportunistically coupling the error management channel with the voltage source, power consumption at the memory device may be reduced.

Features of the disclosure are initially described in the context of systems. Features of the disclosure are described in the context a timing diagram and process flows. These and other features of the disclosure are further illustrated by and described with reference to an apparatus diagram and flowcharts that relate to indicating valid memory access operations.

FIG. 1 illustrates an example of a system 100 that supports indicating valid memory access operations in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general-purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, CK channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, DQ channels 190 may be operable to communicate one or more of data or control information between the host device 105 and the memory device 110. For example, the DQ channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error management channels, which may be referred to as error control channels, error detection code (EDC) channels, or ECC channels. The error management channels may be operable to communicate error detection signals, such as checksums, to improve system reliability. An error management channel may include any quantity of signal paths.

A package may be used to contain and provide access to and from a memory device 110. The package may include pins that give access to and from components within the memory device 110 (e.g., a memory controller, such as a device memory controller 155 or a local memory controller 165, a memory die, such as a memory die 160). In some examples, the package may include DQ pins that allow data to be input to or output from the memory controller. Also, the package may include a write clock (WCK) pin that is used to receive a WCK signal from a host device 105—the WCK signal may be received when a read or write command is issued by the host device 105 and may be used for sampling a data signal received on the DQ pins at the memory device 110. Also, the package may include a read data strobe (RDQS) pin that is used to output a clock signal (which may also be referred to as an RDQS signal)—e.g., when the memory device 110 is configured to operate using a frequency that falls within a range of frequencies. In some examples, the memory device 110 generates the RDQS signal based on the received WCK signal, and a host device 105 may use the RDQS signal for sampling a received data signal. Also, the package may include a data mask inversion (DMI) pin that is used to output error management information—e.g., information for detecting and/or correcting errors. In some examples, a package may similarly be used to contain and provide access to and from a host device 105.

The pins of the package may also be coupled with a bus that includes multiple channels 115. In some examples, the DQ pins of the memory device 110 may be coupled with the DQ channel 190, the RDQS pin may be coupled with a CK channel 188 of the bus, and the DMI pin may be coupled with a DMI channel 191 of the bus. In some examples, the pins of the package and/or the channels 115 of the bus may be terminated (e.g., weakly) to a voltage source or voltage sink (e.g., a ground reference). For example, the DQ pins and/or the DQ channel 190 may be terminated to a ground reference 193 via a first impedance 194. Thus, when the bus is not being used (e.g., is in an idle, inactive, or floating state), the voltage of the pins and channels 115 may trend toward the voltage of a coupled voltage source or voltage sink. In some examples, the pins of the package and/or the channels 115 may not be coupled with a voltage source or voltage sink when the bus in not being used—e.g., may be in a floating state. Alternatively, when the bus is being used (e.g., is in an active state) by either the memory device 110 or the host device 105, the voltage of the channels 115 may be driven by the memory device 110 or the host device 105.

Communications between host device 105 and memory device 110 may fail in some circumstances. A failure may include a scenario where a host device 105 receives invalid data from a memory device 110 without determining that the data is invalid. In such cases, the host device 105 may use the invalid data to perform an operation. A failure rate for a system 100 that includes a host device 105 and memory device 110 may be determined by testing multiple similarly-constructed systems for a time interval and determining a quantity of failures that occur per aggregate hour—e.g., if one hundred systems are tested for one hundred hours, the failure rate may determine a quantity of failures that occur in around 10,000 hours. The testing may yield a quantity of failures expected to occur in one billion hours of operation for the system, which may also be referred to as a failure in time (FIT) rate. The system may be configured to have an acceptable FIT rate—e.g., a FIT rate that is below a threshold. The threshold may be set based on the ramifications of a failure. For example, the more severe an injury that may result from a failure, the stricter the FIT rate may be—e.g., the threshold value may be lower (e.g., less than 4 FITs) if the system is deployed in an application used to operate an automobile (e.g., in an autonomous vehicle).

A failure rate of a system may be affected by a type of packaging used for a memory device 110—e.g., a failure rate may increase as a footprint of the packaging decreases or a density of the packaging is increased, or both, and vice versa. In some examples, changing a package used to contain a memory device 110 may cause the FIT rate for a system 100 (that previously satisfied a FIT rate threshold when the memory device 110 was packaged in a prior package) to exceed the FIT rate threshold when the memory device 110 is packaged in a current package—e.g., due to an increased quantity of mechanical failures that may occur, such as soldering failures or shorting scenarios. For example, packaging a memory device 110 in a fine-pitch ball grid array may cause the FIT rate for the system 100 to increase (e.g., to 25.5 FITs) relative to packaging the memory device 110 in a ball grid array having a larger pitch (e.g., from 2.4 FITs).

Packaging errors that cause a bus between the memory device 110 and host device 105 to improperly enter or remain in a floating state may contribute to a FIT rate of a system 100. In such cases, the host device 105 may be unable to determine whether a signal on the bus is a data signal driven by the memory device 110 (which may be referred to as a valid data signal) or a random data signal that results on the bus when the bus is in a floating state (which may be referred to as an invalid data signal). Also, the host device 105 may determine that a random data signal on the bus is a valid data signal and use invalid data obtained from the random data signal to perform an operation, increasing a FIT rate for the system.

A system 100 may employ data-reliability techniques to achieve an acceptable FIT rate for a system 100. For example, the system 100 may store parity bits with data, where the parity bits may be used to detect and/or correct errors in the data when the data is output to a host device 105. In some examples, the parity bits may be used to generate one or more syndrome bits that indicate which bits in a data packet are defective.

Error protection may be applied to a link between the memory device 110 and the host device 105 (e.g., to data transmitted over DQ channel 190). Such error protection may be referred to as link ECC. In such cases, parity information may be generated for data that is to be transmitted to the host device 105, or vice versa. The parity information may then be transmitted with a set of data during a corresponding read operation. The receiving device may use the parity information to determine whether any errors were introduced into the set of data during the transmission of the set of data and, in some examples, to correct detected errors.

A memory device 110 and/or a host device 105 may include a syndrome check circuit. A syndrome check circuit at a memory device 110 may check syndrome bits associated with a set of data and generate an indication (which may be referred to as the syndrome check signal) for a host device 105 that indicates whether there is an error in the data—e.g., if the syndrome bits include any non-zero syndrome bits. In some examples, the memory device 110 transmits the syndrome check signal to the host device 105 during a corresponding read operation. Thus, the syndrome check signal may enable a host device 105 to quickly identify whether received data includes one or more errors. The syndrome check circuit may also be configured to indicate additional information such as a quantity of errors, phantom errors, a type of error, and the like. In some examples, the memory device 110 also signals the syndrome bits used to generate the syndrome check signal to the host device 105—e.g., the memory device may use the syndrome bits as parity information for the link ECC.

The host device 105 may use the syndrome bits to detect and/or correct one or more errors in the received data. In some examples, the host device 105 may compare the received syndrome bits with the syndrome bits computed for the received data to detect (and, in some examples, correct) errors in the received data. In some examples, the error management information provided by the syndrome check signal, in combination with the error management information determined using the link ECC, may be used to decrease the likelihood of a host device 105 attempting to correct and use received data having multiple bit errors (based on detecting from the link ECC that the data has a single bit error). Thus, a host device 105 may use the information to avoid failures that would otherwise contribute to the FIT rate.

The memory device 110 may also include a master error circuit to improve a reliability of data transfer. The master error circuit may enable a memory device 110 to identify errors caused by the memory controller. For example, the master error circuit may identify errors that occur when a memory device 110 writes different data to memory than what is received or outputs different data to a host device 105 than what is stored in memory—e.g., by accessing an incorrect row when writing to or reading from memory.

To reduce a FIT rate of a system caused by failing to detect an idle bus (e.g., due to bus packaging failures), a memory device 110 may use a control signal (which may be referred to as a valid read operation flag (VROF) signal) to indicate when a bus that connects the memory device 110 and a host device 105 is in an idle state (e.g., a floating state) or when the bus is in an active state. That is, the valid read operation flag may be used to indicate whether a read operation is currently being performed by the memory device 110 (e.g., using a high voltage) or that no valid read operation is currently being performed (e.g., using a low voltage). Thus, in some examples, a host device 105 may discard decoded data after determining that the corresponding data signal was obtained from an idle bus (e.g., a floating bus) based on receiving a VROF signal.

In some examples, the VROF signal, syndrome check signal generated by the syndrome check circuit, a syndrome bit signal including the syndrome bits, the master error status signal generated by the master error circuit, or any combination thereof, may be outputted on the DMI pin. The memory device 110 may include a multiplexer that may be used to switch between the VROF signal, the syndrome check signal, the master error status signal, and the link ECC signal.

A first protocol may be used that enables the error management information to be communicated between a memory device 110 and host device 105—the protocol may be referred to as a DSF+VROF protocol. In such examples, during a first unit interval of a read operation, a VROF signal may be outputted on the DMI pin; during a next set of unit intervals of the read operation, the syndrome check signal may be outputted on the DMI pin; during a following set of unit intervals of the read operation, the master error status signal may be outputted on the DMI pin, and, during a subsequent set of unit intervals of the read operation, the link ECC signal may be outputted on the DMI pin. Concurrently, the data associated with the read operation may be transmitted over the DQ pins during each of the unit intervals. In some examples, a second protocol may be used that enables a portion of the error management information to be communicated between a memory device 110 and host device 105—e.g., a VROF signal may not be transmitted during the first unit interval of a read operation, but the other error management signals may be transmitted during the subsequent unit intervals when the second protocol is enabled, for example, during the same sets of unit intervals as for the first protocol. The second protocol may be referred to as a DSF+ protocol. In some examples, a third protocol may be used that enables a smaller portion of the error management information to be communicated between a memory device 110 and host device 105—e.g., only the link ECC signal may be transmitted during a read operation, for example, during the same set of unit intervals as for the first and second protocols.

The unit intervals may be determined based on a read clock signal outputted on the RDQS pin, where each unit interval corresponds to the duration between a falling edge of the read clock and a subsequent rising edge of the read clock. The read clock may be aligned with the outputting of data packets on the DQ pins. In some examples, the read clock is output by the memory device 110 when the memory device 110 is operated within a particular frequency range. When operating outside of the frequency range, the memory device 110 may not output the read clock signal. In such cases, the unit intervals may be determined based on a write clock signal generated at the host device 105. In some examples, the RDQS signal may be generated using differential signals that correspond to a write clock signal received from the host device 105—e.g., an inverted and non-inverted version of the write clock signal (which may be referred to as a differential strobe technique). In other examples, the RDQS signal may be generated using the non-inverted version of a write clock signal received from the host device 105 (which may be referred to as a single-ended strobe technique).

A host device 105 may use a protocol that does not support communicating one or more of the valid operation signal, the syndrome check signal, or the master error status signal—though, in some examples, the memory device 110 may still generate the underlying data for the signals. Thus, a host device 105 may be unable to receive supplemental error management signaling from a memory device 110. For example, the host device 105 may be unable to receive a valid operation signal, and thus, may be unable to determine whether a valid operation is being performed in a duration during which the operation is expected. Accordingly, communication errors between the memory device 110 and host device 105 may increase—e.g., if the host device 105 uses invalid data obtained during a duration during which the operation was expected to be performed but was not. Thus, a failure rate associated with the memory device may also increase, and, in some examples, may exceed a threshold.

To support the communication of supplemental error management information between a memory device 110 and a host device 105 when a protocol associated with communication supplemental error management information is not supported by the host device 105, enhanced signaling techniques for the supplemental management information may be used.

In some examples, to indicate valid operations (e.g., valid read operations), transmission-side counters and reception-side counters that keep track of valid operations may be used. For example, a memory device 110 may update a counter at the memory device 110 each time a valid command (e.g., read command) is received at the memory device 110. Receiving a valid command may include successfully decoding a signal received at the memory device 110 in a command/address channel. In some examples, a value of the counter may be stored in a register at the memory device 110, and the memory device 110 may write an updated value to the register each time a valid command is received. Also, the host device 105 may update a counter at the host device 105 each time a command is transmitted to the memory device 110. In some examples, the host device 105 may, at some times (e.g., periodically, when a threshold is satisfied, etc.) request to read the register (e.g., using a mode register read command). The host device 105 may compare the received value of the counter at the memory device 110 with a value of the counter at the host device 105. If the values of the counters match, the host device 105 may determine that the data read from the memory device 110 was valid for a duration spanning an initialization and reading of the counters. If the values of the counters differ, the host device 105 may determine that at least a portion of the data read from the memory device 110 was invalid.

In some examples, to indicate valid operations in real time, a valid operation signal may be encoded into a link ECC signal. For example, a memory device 110 may couple the DMI channel 191 with a voltage source (e.g., a high supply voltage source) based on receiving a WCK signal from a host device 105. The memory device 110 may maintain the coupling between the DMI channel 191 and the voltage source until a command (e.g., a read command or a write command) is processed at the memory device (which may be referred to as a qualified time) or the WCK signal ends. In examples when a memory device 110 fails to receive a command transmitted from a host device 105, the DMI channel 191 may remain coupled with the voltage source throughout a duration for performing the operation associated with the command. Particularly, the DMI channel 191 may remain coupled with the voltage source during a duration of the operation for transmitting link ECC information. In such cases, the host device 105 may determine the link ECC signal represents all logic 1's and determine that the operation is invalid, that the data associated with the operation is invalid, or both. Also, the memory device 110 may isolate the DMI channel 191 from the voltage source after the WCK signal ends.

If a memory device 110 successfully receives a command transmitted from the host device 105, the DMI channel 191 may be isolated from the voltage source throughout a duration for performing the operation associated with the command, and the DMI channel may be driven based on error management information determined for the data. In such cases, the host device 105 may determine the operation is valid and that the link ECC signal includes error management information for a corresponding set of data.

To couple the DMI channel 191 with the voltage source, a switching component 197 (which may be controllable by memory device 110) may be used to connect and disconnect the DMI channel 191 to and from a voltage source 195 via a second impedance 196. In some examples, the second impedance 196 may be the largest impedance available at the memory device 110. In some examples, the second impedance 196 may be a combination of impedances at memory device 110—e.g., multiple switching components may be used to place a set of impedances in series. In some examples, the memory device 110 may include a detection circuit that activates the switching component 197 when a WCK signal is received via a CK channel 188 and deactivates the switching component 197 when the WCK signal ends or a command is received via CA channel 186, whichever occurs first. The detection circuit may include a set of logic components configured to implement this operation.

Figure 2:
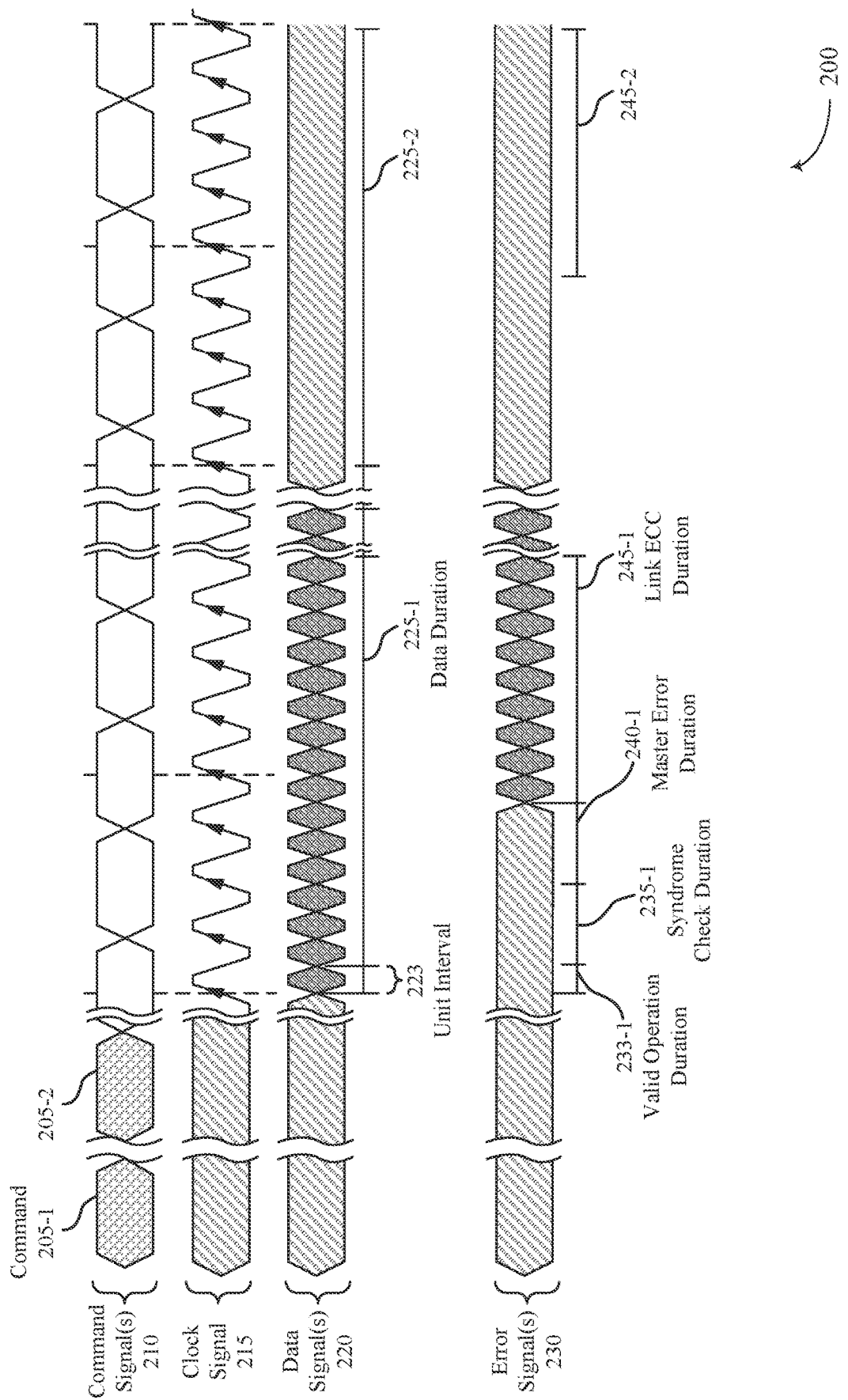
FIG. 2 illustrates an example of a signal diagram that supports indicating valid memory access operations in accordance with examples as disclosed herein.

FIG. 2 illustrates an example of a signal diagram that supports indicating valid memory access operations in accordance with examples as disclosed herein.

Signal diagram 200 depicts representations of a set of signals being transmitted during a time interval. Signal diagram 200 includes a representation of one or more command signals 210, a clock signal 215, one or more data signals 220, and one or more error signals 230. In some examples, command signals 210 may be communicated over a command/address channel (such as CA channel 186 of FIG. 1). Clock signal 215 may be communicated over a clock channel (such as CK channel 188 of FIG. 1). Data signals 220 may be communicated over a data channel (such as DQ channel 190 of FIG. 1). And error signals 230 may be communicated over an error management channel (such as DMI channel 191 of FIG. 1).

Commands 205 may be received in command signal 210. Among other types of commands, commands 205 may be read commands, write commands, or a combination thereof. Commands 205 may trigger data to be transmitted in data signal 220. In some examples, first command 205-1 triggers data to be transmitted during first data duration 225-1. First command 205-1 may also trigger clock signal 215 to be generated. Clock signal 215 may be an RDQS clock signal. In some examples, clock signal 215 is used to designate unit intervals 223, where a unit interval may span a duration between a rising edge and falling edge of a clock pulse. In some examples, new sets of information (e.g., sets of data, error management bits, etc.) may be transmitted each unit interval 223. In some examples, a WCK signal is received before a command 205 is received, where a beginning of the WCK signal may indicate that a command 205 is forthcoming. In some examples, the RDQS clock is generated based on the WCK signal. A period between receiving a WCK signal and receiving a command may be referred to as a qualified time.

Error management information may be communicated with data to enable the detection and correction of errors in the data. In some examples, the error management information may be transmitted during corresponding duration. For example, a valid operation flag (e.g., a VROF) may be transmitted during first valid operation duration 233-1, a syndrome check signal may be transmitted during first syndrome check duration 235-1, a master error status may be transmitted during first master error duration 240-1, and an error correction code (e.g., parity bits) may be transmitted during first link ECC duration 245-1. First valid operation duration 233-1 may span a first unit interval of first data duration 225-1, first syndrome check duration may span a next three unit intervals of first data duration 225-1, first master error duration 240-1 may span a following three unit interval of first data duration 225-1, and first link ECC duration may span the following nine unit intervals of first data duration 225-1.

One or more of a valid operation signal, syndrome check signal, or master error status signal may not be communicated—e.g., if a configured communication protocol does not support communication of such error management signaling. For example, a VROF signal may not be transmitted during a valid operation duration 233, which may correspond to a first unit interval of a data duration 225. Additionally, or alternatively, a syndrome check signal may not be transmitted during a first syndrome check duration 235-1. In such cases, a voltage of error signal 230 may be at a first voltage level during valid operation durations 233, syndrome check durations 235, master error durations 240, or a combination thereof, when a DMI pin is not being driven—e.g., based on a termination of the DMI pin to a voltage source or voltage sink providing the first voltage level. Or at an indeterminate voltage level—e.g., if the DMI pin is in a floating state when the DMI pin is not being driven.

Also, in some examples, no data signaling or error management signaling may be transmitted for a transmitted command (e.g., second command 205-2)—e.g., if a memory device fails to process (e.g., receive or decode) the transmitted command. In such cases, data signal 220 and error signal 230 may be at a terminated voltage level or at an indeterminate voltage level. Also, the device that transmitted the command (e.g., a host device) may be unable to determine on its own that the memory device failed to process the command. Thus, in some examples, the transmitting device may assume that the voltages of data signal 220 on a DQ channel during second data duration 225-2 represent valid data (e.g., all 0's) and that the voltage of error signal 230 on a DMI channel during second link ECC duration 245-2 represent valid link ECC information (e.g., all 0's). Accordingly, the transmitting device may compute parity information for data signal 220 (e.g., which may be all 0's when the data signal represents all 0's) and determine that the parity information matches the link ECC information (e.g., which be all 0's). Based on the computed parity information matching the link ECC information, the transmitting device may determine that the received data is valid and attempt to use the received data despite the received data being invalid, resulting in a failure.

The host device may update (e.g., increment) a counter each time a command is transmitted to the memory device to enable the host device to determine whether a valid operation has been executed for each command of a set of commands transmitted to a memory device. And the memory device may update a counter each time a command is successfully received from the host device. At some intervals (e.g., periodic intervals, after a triggering event, or both), the host device may transmit a command associated with determining whether the counter at the host device matches the counter at the memory device. In some examples, a duration of the periodic interval is based on a processing time at the host device—e.g., the duration may be shorter than a duration associated with the host device using data received from the memory device. In some examples, the triggering event is associated with a quantity of commands transmitted by the host device.

The command transmitted by the host device may include a request to read a register at the memory device that stores a value of the counter at the memory device. In such cases, the host device may compare the received value of the counter at the memory device with the value of the counter at the host device to determine whether each transmitted command was executed. If the values of the counters are different, the host device may discard data received during a duration associated with initializing the counters and reading the register. In some examples, the command transmitted by the host device may include or be associated with a value of the counter at the host device and the memory device may compare the values to determine whether each transmitted command was executed. The memory device may indicate to the host device a result of the comparison.

In some examples, to enable a host device to determine whether a valid operation is currently being executed for a command transmitted to a memory device, a memory device may couple a voltage of a DMI pin to a voltage source after receiving a signal from the host device that is indicative of a forthcoming read or write command (e.g., a WCK signal). The voltage may maintain the voltage of the DMI pin (and therefore error signal 230) at a high voltage level until a command (e.g., a read command or write command) is successfully received or the WCK signal ends.

For example, after failing to receive second command 205-2, a voltage of error signal 230 may be trend to a high voltage level—based on the DMI pin being coupled with the voltage source. Accordingly, a voltage of error signal 230 may be high prior to a beginning of second data duration 225-2 and throughout second link ECC duration 245-2. In such cases, a host device may assume that the voltages of data signal 220 on a DQ channel during second data duration 225-2 (e.g., which may represent all 0's) represent valid data and that the voltage of error signal 230 on a DMI channel during second link ECC duration 245-2 (e.g., which may now represent all 1's) represent valid link ECC information. Accordingly, the transmitting device may compute parity information for data signal 220 (e.g., which may represent all 0's when the data signal represents all 0's) and determine that the parity information is different than the link ECC information (e.g., which may also represent all 0's). Based on the computed parity information being different than the link ECC information (e.g., by more than one bit), the transmitting device may determine that the received data is invalid and discard the data.

Alternatively, if the memory device receives second command 205-2, a data signal may be communicated during second data duration 225-2, the voltage of error signal 230 may be isolated from the voltage source, and a link ECC signal for the data signal may be communicated during second link ECC duration 245-2. In such cases, the host device may similarly compute parity information for the data received in the data signal and compare computed the parity information with the parity information received in the link ECC signal to detect, and in some examples, correct errors in the received data.

Figure 3:
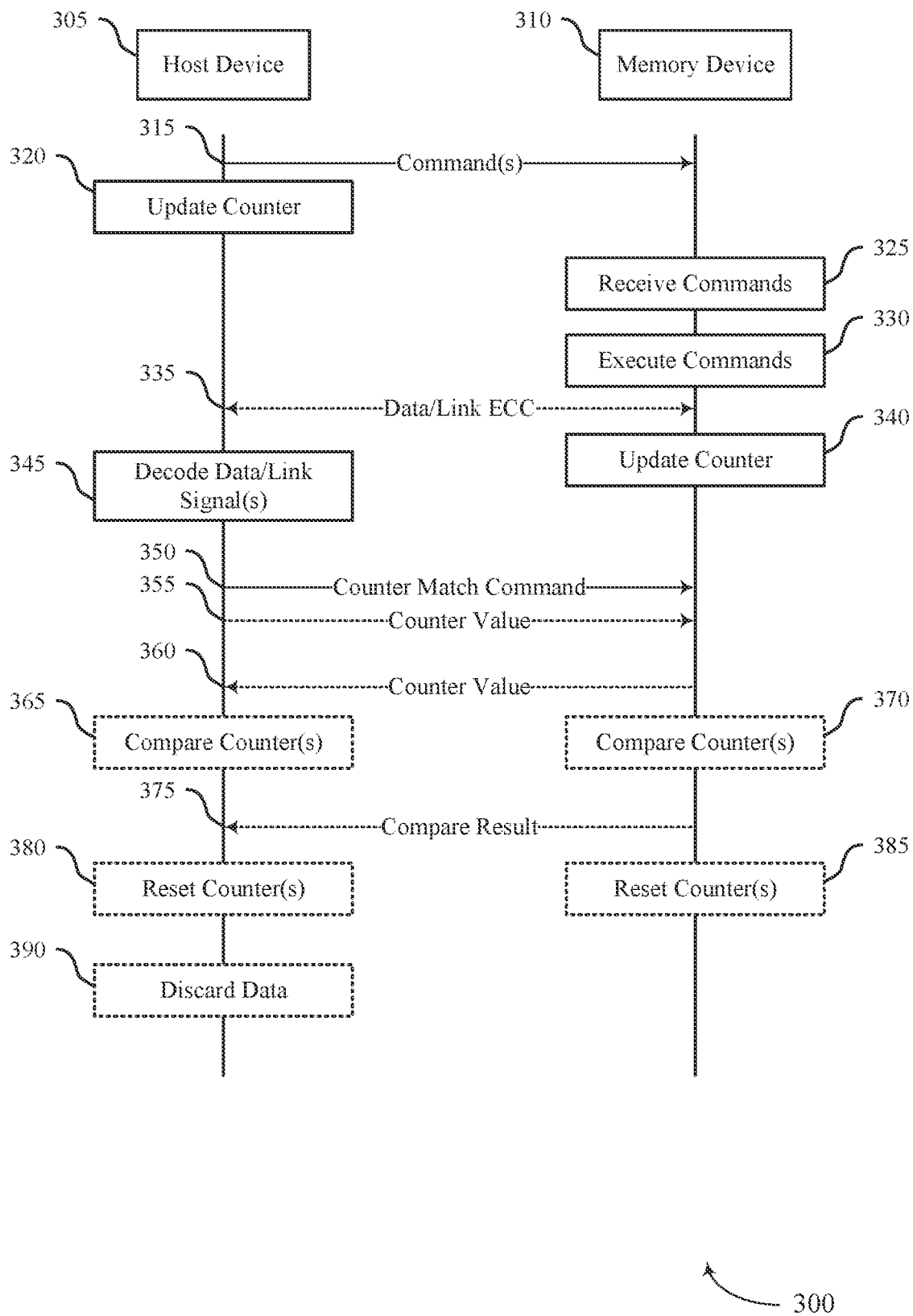
FIGS. 3 and 4 illustrate example sets of operations that support indicating valid memory access operations in accordance with examples as disclosed herein.

FIG. 3 illustrates an example of a set of operations that supports indicating valid memory access operations in accordance with examples as disclosed herein.

Process flow 300 may be performed by host device 305 and memory device 310, which may be examples of a host device or memory device described above with reference to FIGS. 1 and 2. In some examples, process flow 300 illustrates an example sequence of operations performed to support indicating memory access operations. For example, process flow 300 depicts operations for maintaining a counter at host device 305 that keeps track of a quantity of command transmitted and a counter at memory device 110 that keeps track of a quantity of commands received to determine whether each command is associated with a valid operation.

The operations described in process flow 300 may be performed earlier or later in the process, omitted, replaced, supplemented, or combined with another operation. Also, additional operations described herein that are not included in process flow 300 may be included.

At block 315, host device 305 may transmit one or more commands to memory device 310. The one or more commands may include read commands and write commands, among others.

At block 320, host device 305 may update a counter each time a command is sent. In some cases, host device 305 updates the counter each time a specific type of command is sent—e.g., a read command. In some examples, the counter is initialized at a value (e.g., 0) before the commands are transmitted.

At block 325, memory device 310 may receive at least a portion of the one or more commands transmitted from host device 305. In some examples, receiving a command includes detecting a set of signals on a command/address bus and decoding the set of signals to determine a corresponding command.

At block 330, memory device 310 may execute the decoded commands. In some examples, the decoded command is a read command. In some examples, the decoded command is a write command.

At arrow 335, host device 305 and memory device 310 may exchange data based on the decoded commands—e.g., as part of executing a memory operation. In some examples, the data is transmitted over a set of DQ lines. For a write command, memory device 310 may receive data transmitted from host device 305. For a read command, memory device 310 may transmit data to host device 305. Error control information (e.g., parity bits) associated with the data may also be exchanged between host device 305 and memory device 310.

In some examples, memory device 310 may fail to receive a command from host device 305. For example, memory device 310 may fail to receive a read command. In such cases, memory device 310 may not transmit data to host device 305 associated with the read command. In another example, memory device 310 may fail to receive a write command. In such cases, memory device 310 may not receive data transmitted from host device 305 associated with the write command.

At block 340, memory device 310 may update a counter associated with receiving valid commands. In some examples, memory device 310 updates the counter after decoding a command. In some examples, memory device 310 updates the counter after executing a received command. In some cases, a value of the counter is stored in a mode register at memory device 310. In such cases, each time the value of the counter is updated (e.g., incremented), memory device 310 writes the updated value of the counter to the mode register. In some cases, memory device 310 may update the counter in response to performing or executing the valid commands received from the host device 305.

At block 345, host device 305 may decode data signals detected from a set of DQ lines—e.g., during durations associated with communicating data for the set of transmitted commands. Host device 305 may detect invalid data signals on the DQ lines that are not being driven by memory device 310 (e.g., a signal representing all 0's)—e.g., during a data duration corresponding to a read command transmitted by host device 305. Host device 305 may also detect error detection signals on a DMI line that is not being driven by memory device 310 (e.g., a signal representing all 0's)—e.g., during a link ECC duration corresponding to a read command transmitted by host device 305.

At arrow 350, host device 305 may transmit a command to memory device 310 for determining whether a value of the counter at host device 305 matches the counter at memory device 310. In some examples, host device 305 transmits the command before the data obtained by decoding the data signals is used—e.g., during a duration associated with obtaining and using data at host device 305.

In some examples, host device 305 transmits a command associated with indicating a value of the counter at host device 305. In such cases, host device 305 may also transmit a value of the counter at host device 305 to memory device at arrow 355.

In some examples, host device 305 transmits a command for reading the mode register at memory device 310 (which may be referred to as a mode register read command). In such cases, memory device 310 may transmit a value of the counter at memory device 310 (e.g., by transmitting the information in the mode register) to host device 305 at arrow 360.

At block 365, host device 305 may compare a value of the counter at host device 305 with the received value of the counter at memory device 310. In some examples, host device 305 determines that the values of the counters are the same. In other examples, host device 305 determines that the values of the counters are different.

At block 370, memory device 310 may compare a value of the counter at memory device 310 (e.g., after accessing the mode register storing the counter value) with the received value of the counter at host device 305. In some examples, memory device 310 determines that the values of the counters are the same. In other examples, memory device 310 determines that the values of the counters are different.

At arrow 375, memory device 310 may transmit a result of the comparison to host device 305—e.g., if memory device 310 performs the comparison. In some examples, memory device 310 indicates that the values of the counters matched. In other examples, memory device 310 indicates that the values of the counters are different.

At block 380, host device 305 may reset the counter at host device 305—e.g., based on transmitting the command associated with comparing the counter values to memory device 310.

At block 385, memory device 310 may reset the counter at memory device 310—e.g., based on receiving the command associated with comparing the counter values from host device 305.

At block 390, host device 305 may discard the data decoded at block 345 based on determining that the value of the counter at host device 305 is different than the value of the counter at memory device 310. Otherwise, if host device 305 determines that the value of the counter at host device 305 is the same as the value of the counter at memory device 310, then host device 305 may use the decoded data.

Figure 4:
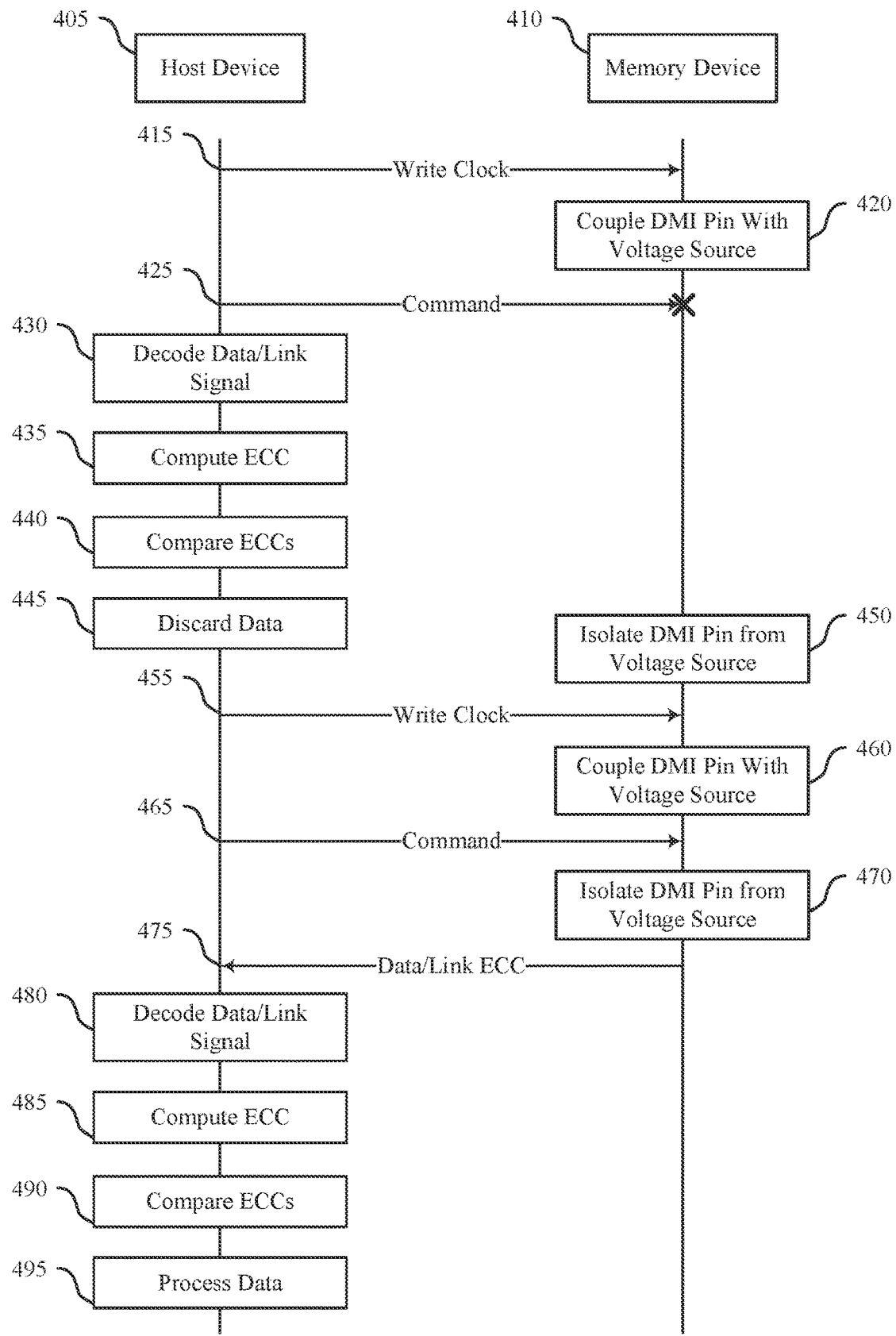

FIG. 4 illustrates an example of a set of operations that supports indicating valid memory access operations in accordance with examples as disclosed herein.

Process flow 400 may be performed by host device 405 and memory device 410, which may be examples of a host device or memory device described above with reference to FIGS. 1 through 3. In some examples, process flow 400 illustrates an example sequence of operations performed to support indicating memory access operations. For example, process flow 400 depicts operations for opportunistically coupling an error management pin with a voltage source to indicate whether a valid operation (e.g., a valid read operation) is occurring.

The operations described in process flow 400 may be performed earlier or later in the process, omitted, replaced, supplemented, or combined with another operation. Also, additional operations described herein that are not included in process flow 400 may be included.

At arrow 415, host device 405 transmits a WCK signal to memory device 410 based on determining a forthcoming read or write command is to be transmitted to memory device 410.

At block 420, memory device 410 may couple an error management pin (e.g., a DMI pin) with a voltage source based on detecting a beginning of the WCK signal. In some examples, the voltage source is a high voltage source in memory device 410. In some examples, before the DMI pin is coupled with the voltage source, the DMI pin may be floating (e.g., unterminated) or coupled with a low voltage source (e.g., a reference voltage, such as a ground). By connecting the error management pin to the voltage source based on receiving the WCK signal, memory device 410 may set the DMI pin to indicate an invalid operation.

In some examples, to couple the DMI pin with the voltage source, memory device 410 activates a switch that connects the DMI pin to an impedance that is electrically positioned between the DMI pin and the voltage source. In some examples, the impedance is the highest available impedance at memory device 410. In some cases, memory device 410 activates one or more switches to combine multiple impedances available at memory device 410—e.g., to increase an impedance between the DMI pin and voltage source.

At arrow 425, host device 405 may transmit a command to memory device 410—e.g., based on transmitting the WCK signal to memory device 410. In some examples, the command may not be successfully processed by memory device 410. In some examples, interference to the command/address lines, shorts at a package used for memory device 410, and the like may result in memory device 410 failing to receive and/or decode the command transmitted by host device 405. Thus, memory device 410 may not be triggered to execute a sequence of operations associated with the command. Accordingly, the DMI pin may remain coupled with the voltage source.

At block 430, host device 405 may decode data signals detected from a set of DQ lines—e.g., during a duration associated with the communicating data for the transmitted command. That is, host device 405 may decode data signals detected from a set of DQ lines in a duration during which host device 405 expects memory device 410 to communicate data requested by the command transmitted by host device 405. However, memory device 410 may not communicate any data during the data duration because of the failure to process (e.g., receive or decode) the command. As described herein, in some examples, host device 405 may detect invalid data signals on the DQ lines that are not being driven by memory device 410 (e.g., a signal representing all 0's)—e.g., during a data duration corresponding to a read command transmitted by host device 405. Host device 305 may detect a data signal on the DQ lines that represents all 0's based on the DQ pins being terminated to the low voltage source.

Host device 405 may also detect an error detection signal on the DMI line that is not being driven by memory device 410—e.g., during a link ECC duration corresponding to a read command transmitted by host device 405. Based on memory device 410 coupling the DMI pin with the voltage source, host device 405 may detect a link ECC signal on the DMI line that represents all 1's—that is based on a voltage of the DMI line being at a high voltage level.

At block 435, host device 405 may compute an error correction code (e.g., a parity code) based on the decoded data. In examples when the decoded data include all 0's, host device 405 may compute an error correction code that include all 0's.

At block 440, host device 405 may compare the computed error correction code with the error correction code decoded from the link ECC signal (which may be referred to as the link error correction code). As described herein, the link ECC signal may include all 1's based on the DMI pin being coupled with the voltage source. Based on comparing the computed error correction code with the link error correction code, host device 405 may determine that the computed error correction code is different than the link error correction code.

At block 445, host device 405 may discard the data based on determining that the computed error correction code is different than the link error correction code. In some examples, host device 405 discards the data based on more than one bit of the computed error correction code and the link ECC code being different—e.g., based on determining that there is an uncorrectable error in the decoded data.

At block 450, memory device 410 may isolate the DMI pin from the voltage source. In some examples, memory device 410 isolates the DMI pin from the voltage source based on detecting an end of the WCK signal. In some examples, to isolate the DMI pin from the voltage source, memory device 410 deactivates the switch that is electrically positioned between the DMI pin and the impedance that is coupled with the voltage source.

At arrow 455, host device 405 may transmit a second WCK signal in anticipation of sending a command to memory device 410. And memory device 410 may detect the beginning of the second WCK signal.

At block 460, memory device may again couple the DMI pin with the voltage source based at least in part on receiving second WCK signal, as similarly described with reference to block 420.

At arrow 465, host device 405 may transmit a second command to memory device 410 based on transmitting the second WCK signal. In some examples, the second command is a read command.

Memory device 410 may successfully process (e.g., receive and decode) the second command received from memory device. In some examples, memory device 410 may determine that the second command is a read command based on successfully processing the second command. In some examples, the duration between detecting the beginning of the WCK signal and receiving the command may be referred to as a qualified time.

At block 470, memory device 410 may isolate the DMI pin from the voltage source based on successfully processing the command. In some examples, memory device 410 may isolate the DMI pin from the voltage source after processing the command—e.g., prior to executing the command. Thus, memory device 410 may be able to drive the DMI pin without interference from the DMI pin being coupled with the voltage source.

At arrow 475, memory device 410 may transmit a set of data (e.g., via the DQ lines in a data signal) and link error correction code (e.g., via the DMI line in a link ECC signal) in response to receiving the command.

At block 480, host device 405 may decode the data signal and link ECC signal to obtain a set of data and a link error correction code. In some examples, the link error correction code is a non-zero binary value that is generated based on the set of data transmitted by memory device 410.

At block 485, host device 405 may compute an error correction code based on the received data signal. In some examples, the computed error correction code is a non-zero binary value that is generated based on the set of data decoded by host device 405.

At block 490, host device 405 may compare the computed error correction code with the link error correction code. In some examples, host device 405 determines that the computed error correction code is the same as the link error correction code. In such cases, host device 405 may use the decoded data. In some examples, host device 405 determines that the computed error correction code is different than the link error correction code. In some examples, after determining the computed and link error correction codes are different, host device 405 may correct the decoded data—e.g., if a single bit of the computed and link error correction codes is different. In other examples, after determining the computed and link error correction codes are different, host device 405 may discard the decoded data—e.g., if multiple bits of the computed and link error correction codes are different.

At block 495, host device 405 may use the decoded data based on determining that the computed ECC and link ECC are the same. In some examples, host device 405 may correct the decoded data based on determining that the computed ECC and link ECC are different and use the corrected data.

In some examples, memory device 410 supports a dual-rank mode enabling multiple dies share a DMI pin. In such cases, the pull-up impedance used to couple the DMI pin with the voltage source may be configured to have a high enough impedance (e.g., to be a weak enough pull-up) to enable an active rank to drive the DMI pin low while the non-active rank causes the DMI pin to be pulled to a high voltage level, while also allowing the DMI pin to be pulled to a high voltage level in a timely manner when both ranks are inactive. In some examples, dual-rank communications may be supported by enabling a dual-rank mode that causes the different ranks to output data in alternating durations. In some examples, a ZQ Calibration master is used to help detect whether a single-rank or dual-rank mode is enabled.

Figure 5:
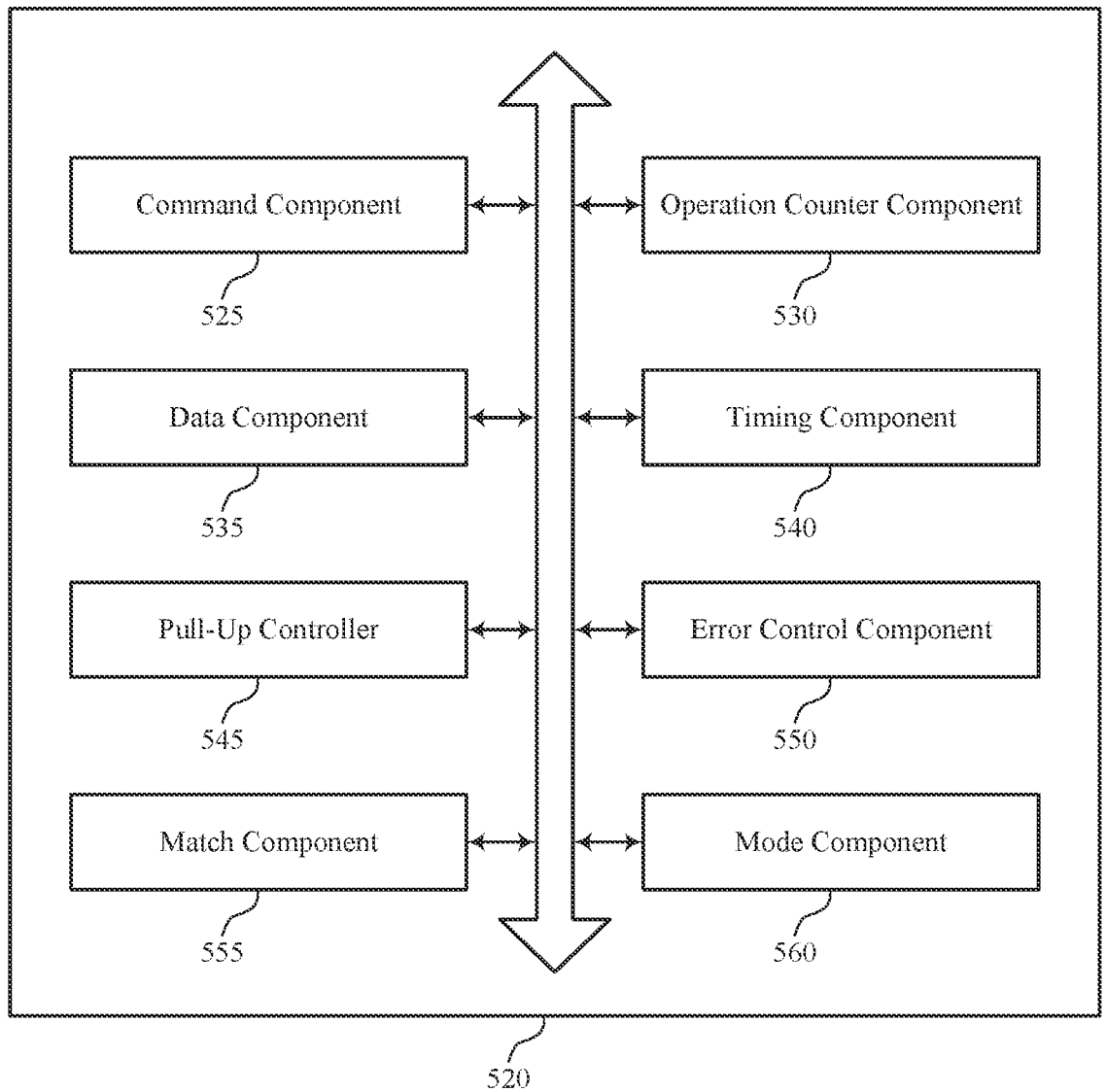
FIG. 5 shows a block diagram of a memory device that supports indicating valid memory access operations in accordance with examples as disclosed herein.

FIG. 5 shows a block diagram 500 of a memory device 520 that supports indicating valid memory access operations in accordance with examples as disclosed herein. The memory device 520 may be an example of aspects of a memory device as described with reference to FIGS. 1 through 4. The memory device 520, or various components thereof, may be an example of means for performing various aspects of indicating valid memory access operations as described herein. For example, the memory device 520 may include a command component 525, an operation counter component 530, a data component 535, a timing component 540, a pull-up controller 545, an error control component 550, a match component 555, a mode component 560, or any combination thereof. Each of these components may communicate, directly or indirectly, with one another (e.g., via one or more buses).

The command component 525 may be configured as or otherwise support a means for receiving, from a host device, a command. The operation counter component 530 may be configured as or otherwise support a means for updating a counter associated with performing a valid operation based at least in part on receiving the command. In some examples, the operation counter component 530 may be configured as or otherwise support a means for receiving, from the host device, a request for a value associated with the counter. The data component 535 may be configured as or otherwise support a means for transmitting, to the host device, the value of the counter based at least in part on receiving the request.

In some examples, the data component 535 may be configured as or otherwise support a means for transmitting, to the host device, a set of data addressed by the command based at least in part on receiving the command, where the counter is updated based at least in part on transmitting the set of data.

In some examples, the operation counter component 530 may be configured as or otherwise support a means for writing one or more bits that indicate the value of the counter to a register based at least in part on updating the counter, where the request for the value of the counter includes a command for reading the register.

In some examples, the operation counter component 530 may be configured as or otherwise support a means for resetting the counter based at least in part on receiving the request for the value of the counter.

In some examples, the operation counter component 530 may be configured as or otherwise support a means for resetting the value of the counter based at least in part on receiving a command to reset the counter.

In some examples, to support updating the counter, the operation counter component 530 may be configured as or otherwise support a means for incrementing the counter based at least in part on performing a read operation in response to receiving the command.

In some examples, the command component 525 may be configured as or otherwise support a means for receiving a plurality of commands including the command. In some examples, the operation counter component 530 may be configured as or otherwise support a means for updating the counter by a value for each command of the plurality of commands that is associated with reading data.

In some examples, the data component 535 may be configured as or otherwise support a means for receiving a value of a second counter at the host device. In some examples, the match component 555 may be configured as or otherwise support a means for determining that the data received at the host device is valid based at least in part on the value of the second counter matching the value of the first counter. In some examples, the match component 555 may be configured as or otherwise support a means for indicating to the host device that the data received at the host device is valid based at least in part on the determining.

In some examples, the data component 535 may be configured as or otherwise support a means for receiving a value of a second counter at the host device. In some examples, the match component 555 may be configured as or otherwise support a means for determining that the data received at the host device is valid based at least in part on the value of the second counter matching the value of the first counter. In some examples, the match component 555 may be configured as or otherwise support a means for indicating to the host device that the data received at the host device is invalid based at least in part on the determining.

The timing component 540 may be configured as or otherwise support a means for receiving, from a host device, a signal providing a clock for reading data from or writing data to a memory device. The pull-up controller 545 may be configured as or otherwise support a means for coupling, based at least in part on receiving the signal, a pin associated with communicating error correction information with a voltage source via a first impedance. In some examples, the pull-up controller 545 may be configured as or otherwise support a means for isolating the pin from the voltage source based at least in part on detecting an end of the signal or processing one or more commands before the end of the signal. The error control component 550 may be configured as or otherwise support a means for indicating a validity of data during a duration associated with reading data from or writing data to the memory device based at least in part on a voltage of the pin during the duration.

In some examples, a set of data pins is in an idle state before the signal providing the clock is received; the pin is isolated from the voltage source before the signal providing the clock is received based at least in part on the set of data pins being in the idle state; and the pin is in a floating state or coupled with a second voltage source via a second impedance based at least in part on the pin being isolated from the voltage source.

In some examples, the command component 525 may be configured as or otherwise support a means for receiving, from the host device, a command before the end of the signal. In some examples, the command component 525 may be configured as or otherwise support a means for processing the command, where the pin is isolated from the voltage source based at least in part on the clock being in an active state and the command being processed. In some examples, the data component 535 may be configured as or otherwise support a means for transmitting, to the host device using a set of data pins, a set of data associated with the command during a first duration of an operation associated with the command. In some examples, the error control component 550 may be configured as or otherwise support a means for transmitting, to the host device using the pin, an error correction code for the set of data during a second duration of the operation.

In some examples, the command component 525 may be configured as or otherwise support a means for failing to process a command received before the end of the signal. In some examples, the timing component 540 may be configured as or otherwise support a means for detecting the end of the signal. In some examples, the pull-up controller 545 may be configured as or otherwise support a means for isolating the pin from the voltage source based at least in part on the end of the signal being detected, where the pin remains coupled with the voltage source until the end of the signal.

In some examples, a voltage of a set of data pins is at a first voltage level during a first period for communicating a set of data associated with the command based at least in part on a failure to process the command, the command being associated with reading data, and the voltage of the pin is at a second voltage level of the voltage source during a second duration for communicating an error correction code based at least in part on the pin remaining coupled with the voltage source until the end of the signal, the voltage of the pin being at the second voltage level during the second duration indicating that the set of data associated with the command on the set of data pins is invalid.

In some examples, the pin is coupled with the voltage source based at least in part on the signal being received and a set of data lines being in an idle state.

In some examples, the mode component 560 may be configured as or otherwise support a means for indicating that a mode associated with multiple ranks is activated. In some examples, the data component 535 may be configured as or otherwise support a means for communicating data for a first rank and a second rank in an alternating pattern based at least in part on indicating that the mode is activated.

In some examples, the one or more commands include a read command, a write command, or both.

Figure 6:
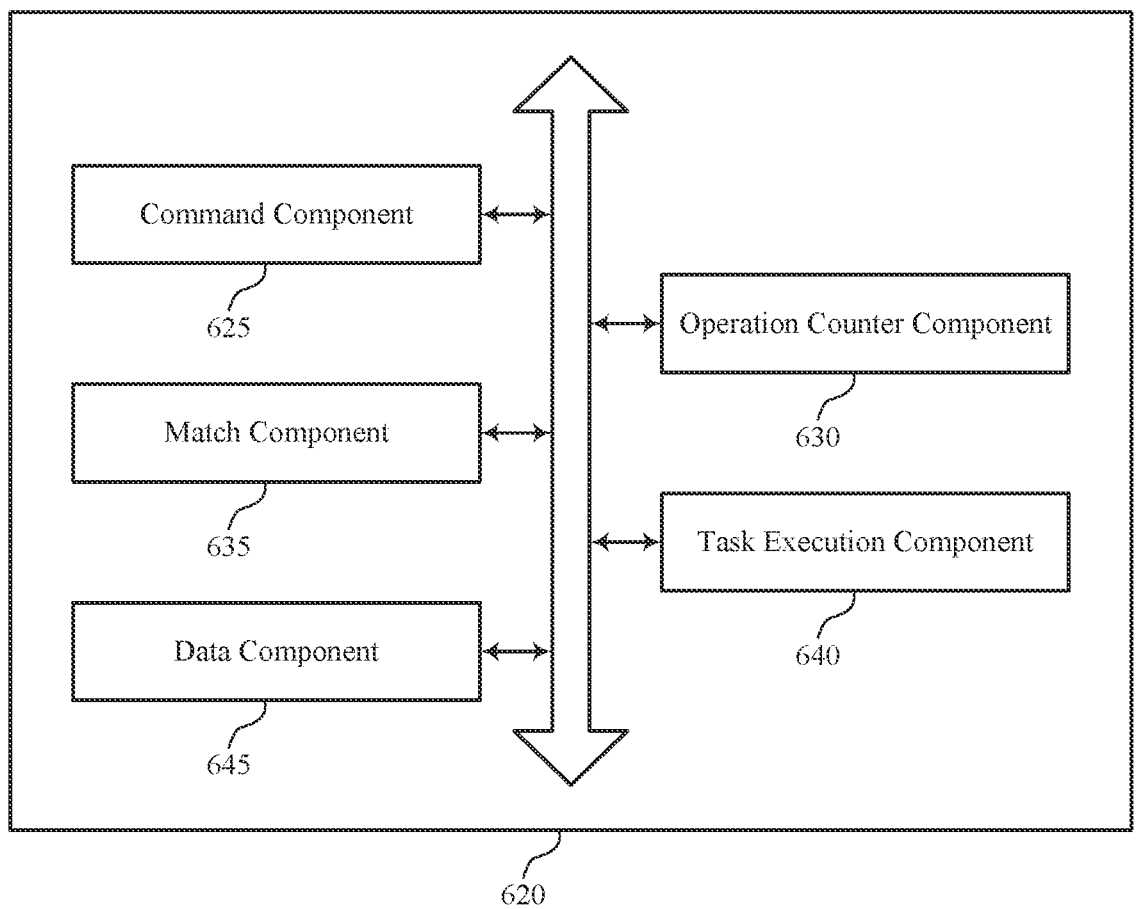
FIG. 6 shows a block diagram of a host device that supports indicating valid memory access operations in accordance with examples as disclosed herein.

FIG. 6 shows a block diagram 600 of a host device 620 that supports indicating valid memory access operations in accordance with examples as disclosed herein. The host device 620 may be an example of aspects of a host device as described with reference to FIGS. 1 through 4. The host device 620, or various components thereof, may be an example of means for performing various aspects of indicating valid memory access operations as described herein. For example, the host device 620 may include a command component 625, an operation counter component 630, a match component 635, a task execution component 640, a data component 645, or any combination thereof. Each of these components may communicate, directly or indirectly, with one another (e.g., via one or more buses).

The command component 625 may be configured as or otherwise support a means for transmitting, to a memory device, a command associated with reading data stored at the memory device. The operation counter component 630 may be configured as or otherwise support a means for updating, at a host device, a value of a first counter based at least in part on transmitting the command. In some examples, the command component 625 may be configured as or otherwise support a means for transmitting, to the memory device, a request for a value of a second counter at the memory device, the value of the second counter at the memory device being based at least in part on a quantity of commands executed by the memory device. The match component 635 may be configured as or otherwise support a means for determining a validity of data received from the memory device based at least in part on the value of the second counter and the value of the first counter. The task execution component 640 may be configured as or otherwise support a means for performing an operation based at least in part on the determining.

In some examples, the match component 635 may be configured as or otherwise support a means for determining that the data received from the memory device is valid based at least in part on the value of the second counter matching the value of the first counter, where performing the operation includes using the data received from the memory device.

In some examples, the match component 635 may be configured as or otherwise support a means for determining that the data received from the memory device is invalid based at least in part on the value of the second counter being different than the value of the first counter, where performing the operation includes discarding the data received from the memory device.

In some examples, the data component 645 may be configured as or otherwise support a means for receiving, based at least in part on the request, the value of the second counter. In some examples, the match component 635 may be configured as or otherwise support a means for comparing, based at least in part on receiving the value of the second counter, the value of the second counter with the value of the first counter, where the validity of the data received from the memory device during a duration associated with initializing the first counter is based at least in part on the comparing.

In some examples, the operation counter component 630 may be configured as or otherwise support a means for initializing the first counter at the host device and the second counter at the memory device. In some examples, the command component 625 may be configured as or otherwise support a means for transmitting, to the memory device, a plurality of commands associated with reading data stored at the memory device based at least in part on initializing the first counter and the second counter, the plurality of commands including the command. In some examples, the operation counter component 630 may be configured as or otherwise support a means for updating the first counter for each command of the plurality of commands transmitted to the host device.

In some examples, to support initializing the second counter at the memory device, the command component 625 may be configured as or otherwise support a means for transmitting, to the memory device, a command to initialize the second counter.

In some examples, the request for the value of the second counter is transmitted based at least in part on the value of the first counter satisfying a threshold quantity or a duration associated with initializing the first counter satisfying a threshold duration, or both.

Figure 7:
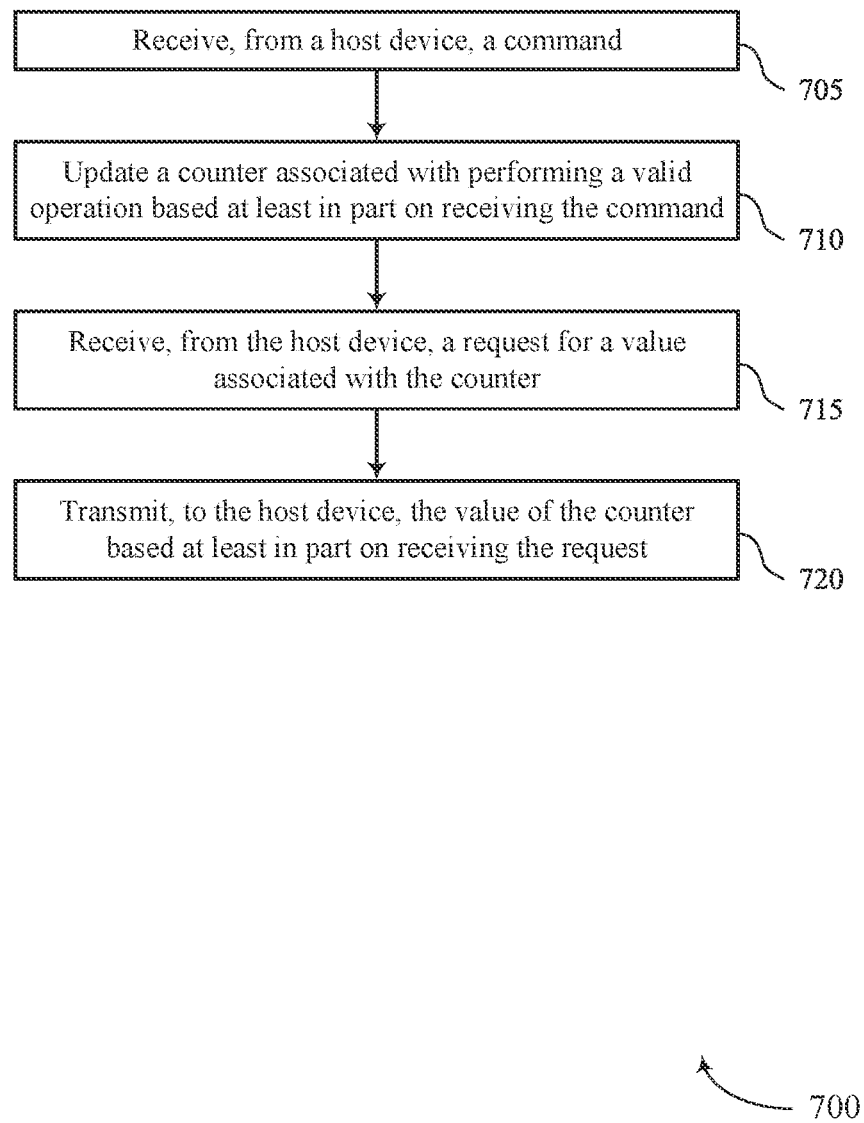
FIGS. 7 through 9 show flowcharts illustrating a method or methods that support indicating valid memory access operations in accordance with examples as disclosed herein.

FIG. 7 shows a flowchart illustrating a method 700 that supports indicating valid memory access operations in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 705, the method may include receiving, from a host device, a command. The operations of 705 may be performed in accordance with examples as disclosed herein. In some examples, aspects of the operations of 705 may be performed by a command component 525 as described with reference to FIG. 5.

At 710, the method may include updating a counter associated with performing a valid operation based at least in part on receiving the command. The operations of 710 may be performed in accordance with examples as disclosed herein. In some examples, aspects of the operations of 710 may be performed by an operation counter component 530 as described with reference to FIG. 5.

At 715, the method may include receiving, from the host device, a request for a value associated with the counter. The operations of 715 may be performed in accordance with examples as disclosed herein. In some examples, aspects of the operations of 715 may be performed by an operation counter component 530 as described with reference to FIG. 5.

At 720, the method may include transmitting, to the host device, the value of the counter based at least in part on receiving the request. The operations of 720 may be performed in accordance with examples as disclosed herein. In some examples, aspects of the operations of 720 may be performed by a data component 535 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving, from a host device, a command, updating a counter associated with performing a valid operation based at least in part on receiving the command, receiving, from the host device, a request for a value associated with the counter, and transmitting, to the host device, the value of the counter based at least in part on receiving the request.

Some examples of the method 700 and the apparatus described herein may further include operations, features, circuitry, logic, means, or instructions for transmitting, to the host device, a set of data addressed by the command based at least in part on receiving the command, where the counter may be updated based at least in part on transmitting the set of data.

Some examples of the method 700 and the apparatus described herein may further include operations, features, circuitry, logic, means, or instructions for writing one or more bits that indicate the value of the counter to a register based at least in part on updating the counter, where the request for the value of the counter includes a command for reading the register.

Some examples of the method 700 and the apparatus described herein may further include operations, features, circuitry, logic, means, or instructions for resetting the counter based at least in part on receiving the request for the value of the counter.

Some examples of the method 700 and the apparatus described herein may further include operations, features, circuitry, logic, means, or instructions for resetting the value of the counter based at least in part on receiving a command to reset the counter.

In some examples of the method 700 and the apparatus described herein, updating the counter may include operations, features, circuitry, logic, means, or instructions for incrementing the counter based at least in part on performing a read operation in response to receiving the command.

Some examples of the method 700 and the apparatus described herein may further include operations, features, circuitry, logic, means, or instructions for receiving a plurality of commands including the command and updating the counter by a value for each command of the plurality of commands that may be associated with reading data.

Some examples of the method 700 and the apparatus described herein may further include operations, features, circuitry, logic, means, or instructions for receiving a value of a second counter at the host device, determining that the data received at the host device may be valid based at least in part on the value of the second counter matching the value of the first counter, and indicating to the host device that the data received at the host device may be valid based at least in part on the determining.

Some examples of the method 700 and the apparatus described herein may further include operations, features, circuitry, logic, means, or instructions for receiving a value of a second counter at the host device, determining that the data received at the host device may be valid based at least in part on the value of the second counter matching the value of the first counter, and indicating to the host device that the data received at the host device may be invalid based at least in part on the determining.

Figure 8:
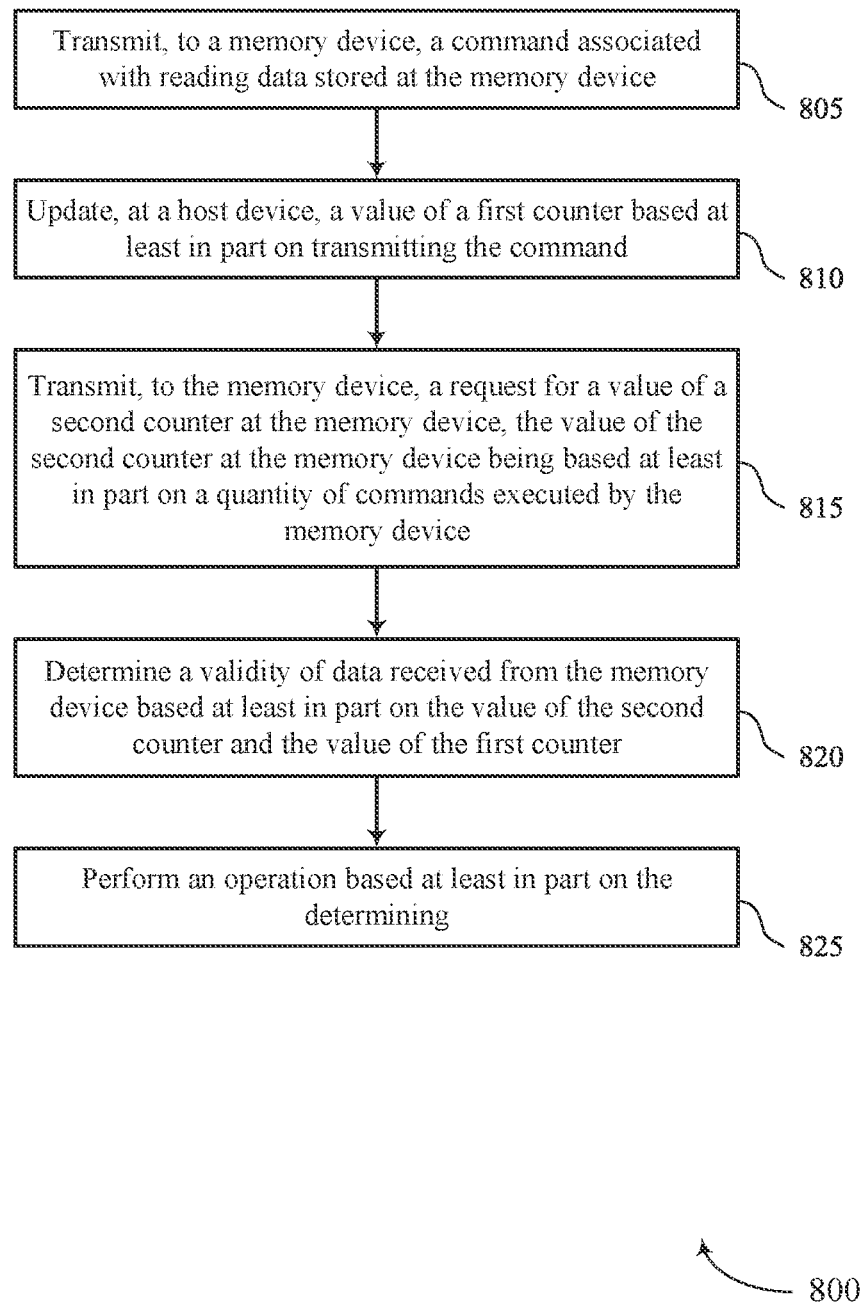

FIG. 8 shows a flowchart illustrating a method 800 that supports indicating valid memory access operations in accordance with examples as disclosed herein. The operations of method 800 may be implemented by a host device or its components as described herein. For example, the operations of method 800 may be performed by a host device as described with reference to FIGS. 1 through 4 and 6. In some examples, a host device may execute a set of instructions to control the functional elements of the device to perform the described functions. Additionally, or alternatively, the host device may perform aspects of the described functions using special-purpose hardware.

At 805, the method may include transmitting, to a memory device, a command associated with reading data stored at the memory device. The operations of 805 may be performed in accordance with examples as disclosed herein. In some examples, aspects of the operations of 805 may be performed by a command component 625 as described with reference to FIG. 6.

At 810, the method may include updating, at a host device, a value of a first counter based at least in part on transmitting the command. The operations of 810 may be performed in accordance with examples as disclosed herein. In some examples, aspects of the operations of 810 may be performed by an operation counter component 630 as described with reference to FIG. 6.

At 815, the method may include transmitting, to the memory device, a request for a value of a second counter at the memory device, the value of the second counter at the memory device being based at least in part on a quantity of commands executed by the memory device. The operations of 815 may be performed in accordance with examples as disclosed herein. In some examples, aspects of the operations of 815 may be performed by a command component 625 as described with reference to FIG. 6.

At 820, the method may include determining a validity of data received from the memory device based at least in part on the value of the second counter and the value of the first counter. The operations of 820 may be performed in accordance with examples as disclosed herein. In some examples, aspects of the operations of 820 may be performed by a match component 635 as described with reference to FIG. 6.

At 825, the method may include performing an operation based at least in part on the determining. The operations of 825 may be performed in accordance with examples as disclosed herein. In some examples, aspects of the operations of 825 may be performed by a task execution component 640 as described with reference to FIG. 6.

In some examples, an apparatus as described herein may perform a method or methods, such as the method 800. The apparatus may include, features, circuitry, logic, means, or instructions (e.g., a non-transitory computer-readable medium storing instructions executable by a processor) for transmitting, to a memory device, a command associated with reading data stored at the memory device, updating, at a host device, a value of a first counter based at least in part on transmitting the command, transmitting, to the memory device, a request for a value of a second counter at the memory device, the value of the second counter at the memory device being based at least in part on a quantity of commands executed by the memory device, determining a validity of data received from the memory device based at least in part on the value of the second counter and the value of the first counter, and performing an operation based at least in part on the determining.

Some examples of the method 800 and the apparatus described herein may further include operations, features, circuitry, logic, means, or instructions for determining that the data received from the memory device may be valid based at least in part on the value of the second counter matching the value of the first counter, where performing the operation includes using the data received from the memory device.

Some examples of the method 800 and the apparatus described herein may further include operations, features, circuitry, logic, means, or instructions for determining that the data received from the memory device may be invalid based at least in part on the value of the second counter being different than the value of the first counter, where performing the operation includes discarding the data received from the memory device.

Some examples of the method 800 and the apparatus described herein may further include operations, features, circuitry, logic, means, or instructions for receiving, based at least in part on the request, the value of the second counter and comparing, based at least in part on receiving the value of the second counter, the value of the second counter with the value of the first counter, where the validity of the data received from the memory device during a duration associated with initializing the first counter may be based at least in part on the comparing.

Some examples of the method 800 and the apparatus described herein may further include operations, features, circuitry, logic, means, or instructions for initializing the first counter at the host device and the second counter at the memory device, transmitting, to the memory device, a plurality of commands associated with reading data stored at the memory device based at least in part on initializing the first counter and the second counter, the plurality of commands including the command, and updating the first counter for each command of the plurality of commands transmitted to the host device.

In some examples of the method 800 and the apparatus described herein, initializing the second counter at the memory device may include operations, features, circuitry, logic, means, or instructions for transmitting, to the memory device, a command to initialize the second counter.

In some examples of the method 800 and the apparatus described herein, the request for the value of the second counter may be transmitted based at least in part on the value of the first counter satisfying a threshold quantity or a duration associated with initializing the first counter satisfying a threshold duration, or both.

Figure 9:
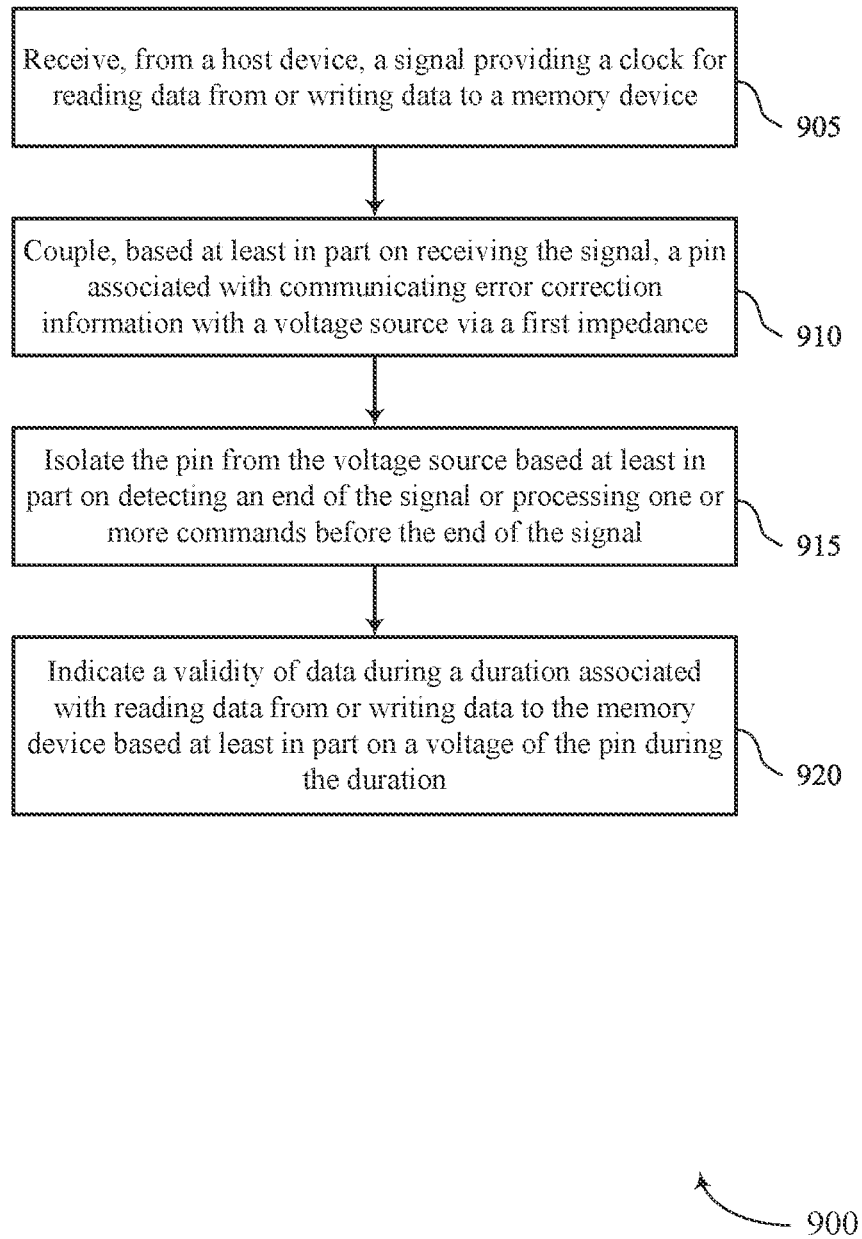

FIG. 9 shows a flowchart illustrating a method 900 that supports indicating valid memory access operations in accordance with examples as disclosed herein. The operations of method 900 may be implemented by a memory device or its components as described herein. For example, the operations of method 900 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 905, the method may include receiving, from a host device, a signal providing a clock for reading data from or writing data to a memory device. The operations of 905 may be performed in accordance with examples as disclosed herein. In some examples, aspects of the operations of 905 may be performed by a timing component 540 as described with reference to FIG. 5.

At 910, the method may include coupling, based at least in part on receiving the signal, a pin associated with communicating error correction information with a voltage source via a first impedance. The operations of 910 may be performed in accordance with examples as disclosed herein. In some examples, aspects of the operations of 910 may be performed by a pull-up controller 545 as described with reference to FIG. 5.

At 915, the method may include isolating the pin from the voltage source based at least in part on detecting an end of the signal or processing one or more commands before the end of the signal. The operations of 915 may be performed in accordance with examples as disclosed herein. In some examples, aspects of the operations of 915 may be performed by a pull-up controller 545 as described with reference to FIG. 5.

At 920, the method may include indicating a validity of data during a duration associated with reading data from or writing data to the memory device based at least in part on a voltage of the pin during the duration. The operations of 920 may be performed in accordance with examples as disclosed herein. In some examples, aspects of the operations of 920 may be performed by an error control component 550 as described with reference to FIG. 5.

In some examples, an apparatus as described herein may perform a method or methods, such as the method 900. The apparatus may include, features, circuitry, logic, means, or instructions (e.g., a non-transitory computer-readable medium storing instructions executable by a processor) for receiving, from a host device, a signal providing a clock for reading data from or writing data to a memory device, coupling, based at least in part on receiving the signal, a pin associated with communicating error correction information with a voltage source via a first impedance, isolating the pin from the voltage source based at least in part on detecting an end of the signal or processing one or more commands before the end of the signal, and indicating a validity of data during a duration associated with reading data from or writing data to the memory device based at least in part on a voltage of the pin during the duration.

In some examples of the method 900 and the apparatus described herein, a set of data pins may be in an idle state before the signal providing the clock may be received; the pin may be isolated from the voltage source before the signal providing the clock may be received based at least in part on the set of data pins being in the idle state; and the pin may be in a floating state or coupled with a second voltage source via a second impedance based at least in part on the pin being isolated from the voltage source.

Some examples of the method 900 and the apparatus described herein may further include operations, features, circuitry, logic, means, or instructions for receiving, from the host device, a command before the end of the signal, processing the command, where the pin may be isolated from the voltage source based at least in part on the clock being in an active state and the command being processed, transmitting, to the host device using a set of data pins, a set of data associated with the command during a first duration of an operation associated with the command, and transmitting, to the host device using the pin, an error correction code for the set of data during a second duration of the operation.

Some examples of the method 900 and the apparatus described herein may further include operations, features, circuitry, logic, means, or instructions for failing to process a command received before the end of the signal, detecting the end of the signal, and isolating the pin from the voltage source based at least in part on the end of the signal being detected, where the pin remains coupled with the voltage source until the end of the signal.

In some examples of the method 900 and the apparatus described herein, a voltage of a set of data pins may be at a first voltage level during a first period for communicating a set of data associated with the command based at least in part on a failure to process the command, the command being associated with reading data, and the voltage of the pin may be at a second voltage level of the voltage source during a second duration for communicating an error correction code based at least in part on the pin remaining coupled with the voltage source until the end of the signal, the voltage of the pin being at the second voltage level during the second duration indicating that the set of data associated with the command on the set of data pins may be invalid.

In some examples of the method 900 and the apparatus described herein, the pin may be coupled with the voltage source based at least in part on the signal being received and a set of data lines being in an idle state.

Some examples of the method 900 and the apparatus described herein may further include operations, features, circuitry, logic, means, or instructions for indicating that a mode associated with multiple ranks may be activated and communicating data for a first rank and a second rank in an alternating pattern based at least in part on indicating that the mode may be activated.

In some examples of the method 900 and the apparatus described herein, the one or more commands include a read command, a write command, or both.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a memory array including an array of memory cells that each include capacitive storage elements, a circuit coupled with the memory array and configured to cause the apparatus to, receive, from a host device, a command, update a counter associated with performing a valid operation based at least in part on receiving the command, receive, from the host device, a request for a value of the counter, and transmit, to the host device, the value of the counter based at least in part on receiving the request.

In some examples, the circuit may be configured to cause the apparatus to transmit, to the host device, a set of data addressed by the command based at least in part on receiving the command, where the counter may be updated based at least in part on transmitting the set of data.

In some examples, the circuit may be configured to cause the apparatus to write one or more bits that indicate the value of the counter to a register based at least in part on updating the counter, where the request for the value of the counter includes a command for reading the register.

In some examples, the circuit may be configured to cause the apparatus to reset the counter based at least in part on receiving the request for the value of the counter.

In some examples, the circuit may be configured to cause the apparatus to reset the value of the counter based at least in part on receiving a command to reset the counter.

Another apparatus is described. The apparatus may include a memory array including an array of memory cells that each include capacitive storage elements, a circuit coupled with the memory array and configured to cause the apparatus to, receive, from a host device, a signal providing a clock for reading data from or writing data to a memory device, couple, based at least in part on receiving the signal, a pin associated with communicating error correction information with a voltage source via a first impedance, isolate the pin from the voltage source based at least in part on detecting an end of the signal or processing one or more commands before the end of the signal, and indicate a validity of data during a duration associated with reading data from or writing data to the memory device based at least in part on a voltage of the pin during the duration.

In some examples of the apparatus, a set of data pins may be in an idle state before the signal providing the clock may be received, the pin may be isolated from the voltage source before the signal providing the clock may be received based at least in part on the set of data pins being in the idle state, and the pin may be in a floating state or coupled with a second voltage source via a second impedance based at least in part on the pin being isolated from the voltage source.

In some examples, the circuit may be configured to cause the apparatus to include receive, from the host device, a command before the end of the signal, process the command, where the pin may be isolated from the voltage source based at least in part on the clock being in an active state and the command being processed, transmit, to the host device using a set of data pins, a set of data associated with the command during a first duration of an operation associated with the command, and transmit, to the host device the pin, an error correction code for the set of data during a second duration of the operation.

In some examples, the circuit may be configured to cause the apparatus to fail to process a command received before the end of the signal, detect the end of the signal, and isolate the pin from the voltage source based at least in part on the end of the signal being detected, where the pin remains coupled with the voltage source until the end of the signal.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, from a host device, a command;
   updating a counter associated with performing a valid operation based at least in part on receiving the command;
   receiving, from the host device, a request for a value of the counter;
   transmitting, to the host device, the value of the counter based at least in part on receiving the request;
   receiving, from the host device, a value of a second counter;
   determining whether data received at the host device is valid based at least in part on the value of the second counter matching the value of the counter; and
   indicating, to the host device, whether the data received at the host device is invalid based at least in part on the determining.

2. The method of claim 1, further comprising:
transmitting, to the host device, a set of data addressed by the command based at least in part on receiving the command, wherein the counter is updated based at least in part on transmitting the set of data.

3. The method of claim 1, further comprising:
writing one or more bits that indicate the value of the counter to a register based at least in part on updating the counter, wherein the request for the value of the counter comprises a command for reading the register.

4. The method of claim 1, further comprising:
resetting the counter based at least in part on receiving the request for the value of the counter.

5. The method of claim 1, further comprising:
resetting the value of the counter based at least in part on receiving a second command to reset the counter.

6. The method of claim 1, wherein updating the counter comprises:
incrementing the counter based at least in part on performing a read operation in response to receiving the command.

7. The method of claim 1, further comprising:
receiving a plurality of commands comprising the command; and
updating the counter for each command of the plurality of commands that is associated with reading data.

8. The method of claim 1, wherein:
the data received at the host device is determined to be valid based at least in part on the value of the second counter matching the value of the counter; and
the data received at the host device is indicated as valid based at least in part on determining that the data is valid.

9. The method of claim 1, wherein:
the data received at the host device is determined to be invalid based at least in part on the value of the second counter being different than the value of the counter; and
the data received at the host device is indicated as invalid based at least in part on determining that the data is invalid.

10. A method, comprising:
transmitting, to a memory device, a command associated with reading data stored at the memory device;
updating, at a host device, a value of a first counter based at least in part on transmitting the command;
transmitting, to the memory device, a request for a value of a second counter at the memory device, the value of the second counter at the memory device being based at least in part on a quantity of commands executed by the memory device;
determining a validity of data received from the memory device based at least in part on the value of the second counter and the value of the first counter; and
performing an operation based at least in part on the determining.

11. The method of claim 10, further comprising:
determining that the data received from the memory device is valid based at least in part on the value of the second counter matching the value of the first counter, wherein performing the operation comprises using the data received from the memory device.

12. The method of claim 10, further comprising:
determining that the data received from the memory device is invalid based at least in part on the value of the second counter being different than the value of the first counter, wherein performing the operation comprises discarding the data received from the memory device.

13. The method of claim 10, further comprising:
receiving, based at least in part on the request, the value of the second counter; and
comparing, based at least in part on receiving the value of the second counter, the value of the second counter with the value of the first counter, wherein the validity of the data received from the memory device during a duration associated with initializing the first counter is based at least in part on the comparing.

14. The method of claim 10, further comprising:
initializing the first counter at the host device and the second counter at the memory device;
transmitting, to the memory device, a plurality of commands associated with reading data stored at the memory device based at least in part on initializing the first counter and the second counter, the plurality of commands comprising the command; and
updating the first counter for each command of the plurality of commands transmitted to the host device.

15. The method of claim 14, wherein initializing the second counter at the memory device comprises:
transmitting, to the memory device, a second command to initialize the second counter.

16. The method of claim 10, wherein the request for the value of the second counter is transmitted based at least in part on the value of the first counter satisfying a threshold quantity or a duration associated with initializing the first counter satisfying a threshold duration, or both.

17. An apparatus, comprising:
a memory array comprising an array of memory cells that each comprise capacitive storage elements; and
a circuit coupled with the memory array and configured to cause the apparatus to:
receive, from a host device, a command;
update a counter associated with performing a valid operation based at least in part on receiving the command;
receive, from the host device, a request for a value of the counter;
transmit, to the host device, the value of the counter based at least in part on receiving the request;
receive, from the host device, a value of a second counter;
determine whether data received at the host device is valid based at least in part on the value of the second counter matching the value of the counter; and
indicate, to the host device, whether the data received at the host device is invalid based at least in part on the determining.

18. The apparatus of claim 17, wherein the circuit is further configured to cause the apparatus to:
transmit, to the host device, a set of data addressed by the command based at least in part on receiving the command, wherein the counter is updated based at least in part on transmitting the set of data.

19. The apparatus of claim 17, wherein the circuit is further configured to cause the apparatus to:
write one or more bits that indicate the value of the counter to a register based at least in part on updating the counter, wherein the request for the value of the counter comprises a command for reading the register.

20. The apparatus of claim 17, wherein the circuit is further configured to cause the apparatus to:
reset the counter based at least in part on receiving the request for the value of the counter.

21. The apparatus of claim 17, wherein the circuit is further configured to cause the apparatus to:
reset the value of the counter based at least in part on receiving a second command to reset the counter.

\* \* \* \* \*